United States Patent
Friedrichs et al.

(10) Patent No.: US 6,815,351 B2
(45) Date of Patent: Nov. 9, 2004

(54) METHOD FOR CONTACTING A SEMICONDUCTOR CONFIGURATION

(75) Inventors: Peter Friedrichs, Nürnberg (DE); Dethard Peters, Höchstadt (DE); Reinhold Schörner, Grossenseebach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 10/384,315

(22) Filed: Mar. 7, 2003

(65) Prior Publication Data

US 2003/0146437 A1 Aug. 7, 2003

Related U.S. Application Data

(62) Division of application No. 09/732,986, filed on Dec. 8, 2000, now abandoned, which is a continuation of application No. PCT/DE99/01657, filed on Jun. 7, 1999.

(30) Foreign Application Priority Data

Jun. 8, 1998 (DE) .......................................... 198 25 520

(51) Int. Cl.$^7$ ................................................. H01L 21/44
(52) U.S. Cl. ....................... 438/688; 438/571; 438/584; 438/597; 438/621; 438/931
(58) Field of Search ............................. 257/77, 78, 81, 257/96, 97, 103, 750; 438/571–573, 584, 597, 621, 688, 767, 931

(56) References Cited

U.S. PATENT DOCUMENTS

| 4,918,497 A | 4/1990 | Edmond |
| 5,323,022 A | 6/1994 | Glass et al. |

FOREIGN PATENT DOCUMENTS

| DE | 41 43 405 C2 | 5/1995 |
| JP | 06-061475 | 3/1994 |

OTHER PUBLICATIONS

Davis et al., "Defects and Impurities in 9H—and 6H—SiC Homoepitaxial Layers: Identification, Origin, Effect on Properties of Ohmic Contacts and Insulating Layers and Reduction", Report 1995, Order No. AD—A 300928, 30 pp. Avail.: NTIS.*
Vossen et al., "Thin Film Process II," Academic Press, Boston, p 107–110 (1991), ibid p. 200–201.*
Liu et al.: "Ohmic Contacts to p–Type SiC with Improved Thermal Stability", Materials Science Forum, vols. 264–268, 1998, pp. 791–794.
Crofton et al.: Titanium and Aluminum–Titanium Ohmic Contacts to p–Type SiC, Solid–State Electronics, Vo. 41, No. 11, 1997, pp. 1725–1729.
Chaudhry et al.: "A Study of Ohmic Contacts on β–SiC", Int. J. Electronics, vol. 71, No. 3, 1991, pp. 439–444.
Chou et al.: "Interfacial Reactions of SiC with NiAl", Scripta Metallurgica et Materialia, vol. 25, 1991, pp. 2059–2064.
Hallin et al.: "Interface Chemistry and Electrical Properties of Annealed Ni and Ni/Al–6H SiC Structures", Inst. Physics Conf. Ser. No. 142, Chapter 3, pp. 601–604.

(List continued on next page.)

*Primary Examiner*—David A. Zurnda
*Assistant Examiner*—Asok Kumar Sarkar
(74) *Attorney, Agent, or Firm*—Laurence A. Greenberg; Werner H. Stemer; Ralph E. Locher

(57) ABSTRACT

A semiconductor configuration with an ohmic contact-connection includes a p-conducting semiconductor region made of silicon carbide. A p-type contact region serves for the contact-connection. The p-type contact region is composed of a material containing at least nickel and aluminum. A substantially uniform material composition is present in the entire p-type contact region. A method for contact-connecting p-conducting silicon carbide with a material containing at least nickel and aluminum is also provided. The two components nickel and aluminum are applied simultaneously on the p-conducting semiconductor region.

12 Claims, 1 Drawing Sheet

OTHER PUBLICATIONS

Harris et al.: "Ohmic Contacts to SiC", Properties of Silicon Carbide, Chapter 9.1, pp. 231–234.

Rastegaeva et al.: "The Influence of Temperature Treatment on the Formation of Ni–BAsed Schottky Diodes and Ohmic Contacts to n–6H–SiC", Materials Science and Engineering, B46, 1997, pp. 254–258.

Marinova et al.: "Nickel Based Ohmic Contacts on SiC", Materials Science and Engineering, B46, 1979, pp. 223–226.

Hallin et al.: "Improved Ni Ohmic Contact on n–Type 4H–SiC", XP–000852876, 1997, pp. 119–122.

* cited by examiner

METHOD FOR CONTACTING A SEMICONDUCTOR CONFIGURATION

CROSS-REFERENCE TO RELATED APPLICATION

This application is a division of U.S. application Ser. No. 09/732,986, filed Dec. 8, 2000, now abandoned which was a continuation of copending International Application No. PCT/DE99/01657, filed Jun. 7, 1999, which designated the United States and which was not published in English.

BACKGROUND OF THE INVENTION

Field of the Invention

The invention relates to a method for contacting a semiconductor configuration.

The invention relates, in particular, to a semiconductor configuration which is composed of a given polytype of silicon carbide at least in specific semiconductor regions, in particular the semiconductor regions which are to be contacted. The semiconductor regions that are to be contacted are in particular p-conducting.

Silicon carbide (SiC) in monocrystalline form is a semiconductor material having outstanding physical properties that seem to make this semiconductor material interesting particularly for power electronics, even for applications in the kV range, inter alia due to its high breakdown field strength and its good thermal conductivity. Since the commercial availability of monocrystalline substrate wafers, especially ones made of 6H and 4H silicon carbide polytypes, has risen, silicon carbide-based power semiconductor components, such as e.g. Schottky diodes, are now also receiving more and more attention. Other silicon carbide components which are becoming increasingly widespread are pn diodes and transistors such as, for example, MOSFETs (Metal Oxide Semiconductor Field Effect Transistors).

Stable ohmic contacts to semiconductor regions of different conduction types are indispensable for the functioning of these components. In this case, the lowest possible contact resistances are sought in order to minimize undesirable losses at the semiconductor-metal junction.

The overview paper "Ohmic contacts to SiC" by G. L. Harris et al. from "Properties of Silicon Carbide" ed. by G. L. Harris INSPEC, 1995, pages 231–234 contains a summary of contacting methods for silicon carbide of different polytypes and conduction types. With regard to the contact-connection of p-conducting SiC, the overview paper and the cross-references cited reveal the current state of the art generally accepted by experts, which is outlined below:

Aluminum is predominately used for contact-connecting p-conducting SiC. Since aluminum is soluble in small amounts in SiC and acts as an acceptor, a zone highly doped with aluminum can be produced in a boundary region between the aluminum-containing contact region and the semiconductor region made of SiC. In order to avoid evaporation of the aluminum, which melts at a temperature as low as 659° C., during a subsequent thermal treatment for forming the ohmic contact, at least one covering layer made of a material having a higher melting point, such as e.g. nickel, tungsten, titanium or tantalum, is applied to the aluminum.

In order to be able to exploit the advantageous contact properties of a specific contact material on p-conducting SiC, these methods of the prior art consequently require a second layer which protects the underlying first layer. The first and second layers are applied by separate, successive technological process steps with different materials in each case.

The paper "Titanium and Aluminium-Titanium Ohmic Contacts to p-Type SiC", Solid-State Electronics, Vol. 41, No. 11, 1997, pages 1725–1729, discloses an aluminum-titanium alloy as material for an ohmic contact on p-conducting SiC. The alloy used in this case has a proportion by weight of 90% for aluminum and correspondingly a portion by weight of 10% for titanium. The contact made of the aluminum-titanium alloy is not covered with a further layer. The paper reports on problems with reproducibility and with very thin contact layers. With thin contact layers, in particular, the aluminum may volatilize from the aluminum-titanium alloy.

The paper "Ohmic Contacts to p-type SiC with improved thermal stability", by Liu, S., et al., $7^{th}$ International Conference on Silicon Carbide, III-Nitrides and Related Materials Stockholm, September 1997 describes an ohmic contact on p-conducting SiC which is produced through the use of a layer structure including an aluminum layer, a nickel layer and a tungsten layer. After this layer structure has been applied, a heat-treatment process is carried out, in the course of which, inter alia, the aluminum and the nickel are mixed together, but a material composition that is homogeneous over the depth of the contact region is not formed. Moreover, this mixing also takes place only in the presence of the third layer made of tungsten. During the heat-treatment process, a considerable proportion of tungsten in turn diffuses from this third layer right into the boundary region of the ohmic contact and of the p-conducting SiC. In this case, however, the tungsten can then lead to impairment of the ohmic contact behavior.

SUMMARY OF THE INVENTION

It is accordingly an object of the invention to provide a method for contacting a semiconductor configuration which overcomes the above-mentioned disadvantages of the heretofore-known semiconductor configurations and methods of this general type and which provide an improved contact-connection of p-conducting SiC in comparison with conventional configurations and methods. In this case, the contact on the p-conducting semiconductor region should have a low contact resistance and should be thermally stable.

With the foregoing and other objects in view there is provided, in accordance with the invention, a semiconductor configuration with an ohmic contact-connection, including:

at least one p-conducting semiconductor region composed of silicon and carbon in a form of silicon carbide;

at least one p-type contact region adjoining the at least one p-conducting semiconductor region and composed of a material having nickel as a first material component and aluminum as a second material component, the at least one p-type contact region having a substantially uniform material composition throughout; and a boundary region extending into the at least one p-conducting semiconductor region and into the at least one p-type contact region, the boundary region being composed substantially exclusively of the silicon and the carbon of the at least one p-conducting semiconductor region and of the nickel and the aluminum of the at least one p-type contact region.

In other words, the semiconductor configuration according to the invention includes:
a) at least one p-conducting semiconductor region made of silicon carbide and b) at least one p-type contact region adjoining the p-conducting semiconductor region, in which case
c) the p-type contact region is composed of a material having nickel as a first material component and aluminum as a second material component,
d) an approximately identical or uniform material composition is present in the p-type contact region, and
e) practically exclusively the silicon and the carbon of the p-conducting semiconductor region and the nickel and the aluminum of the p-type contact region are present in a boundary region, which extends into the p-conducting semiconductor region and into the p-type contact region.

With the objects of the invention in view there is also provided, a method for contacting a semiconductor configuration, the method includes the steps of:

providing at least one p-conducting semiconductor region formed of silicon carbide; and applying a material having nickel as a first material component and aluminum as a second material component on the at least one p-conducting semiconductor region for forming at least one substantially homogeneous p-type contact region on the at least one p-conducting semiconductor region, by simultaneously applying both, the first material component and the second material component such that a given mixture ratio of the first material component and the second material component is established at an interface between the at least one p-conducting semiconductor region and the at least one p-type contact region prior to a heat-treatment process.

In other words, the method according to the invention includes:
a) at least one substantially homogeneous p-type contact region is formed on at least one p-conducting semiconductor region made of silicon carbide by
b) a material having nickel and aluminum as a first and a second material component, respectively, being applied, for providing the p-type contact region, in which case
c) both material components are applied simultaneously, such that a predetermined mixture ratio of both material components is already established at an interface between the p-conducting semiconductor region and the p-type contact region prior to a heat-treatment process.

The invention is based on the insight that, contrary to the customary procedure employed by experts, a stable and reproducible ohmic contact-connection of p-conducting silicon carbide can be effected not only by successively applying two or more layers each of a different material, but rather also through the use of a single layer having an approximately identical, i.e. homogeneous material composition. The relevant p-type contact region is composed of a material containing the materials used for the individual layers in the prior art, namely nickel and aluminum, as first and second material components, respectively. In this case, the material may be present in the form of a mixture, a batch, an alloy or a compound of these two material components.

Prior to the start of the heat-treatment process, a quaternary material system including the individual components silicon, carbon, nickel and aluminum is already present at the interface with SiC. This has a particularly favorable effect on the ohmic contact formation during the heat-treatment process. A desired mixture ratio between the aluminum and the nickel in particular at the interface with the p-conducting SiC can already be established without difficulty during the simultaneous application of the two material components before the heat-treatment process. Since a further covering or protective layer made of another material is not provided on the contact region, the four above-mentioned elements of the quaternary material system are present practically exclusively, i.e. apart from unavoidable contaminants and the dopant atoms of the p-conducting semiconductor region, in the boundary region even after the heat treatment. Possible impairment of the contact resistance as in the case of the prior art does not occur, therefore, since the boundary region is practically free of undesirable impurity atoms.

Compared with the simultaneous application of both material components, successive application of a first layer of aluminum and a second layer of nickel would be less favorable since, during the subsequent heat-treatment process, the two material components would first have to be mixed together to a sufficient extent in order to be available equally at the interface. Consequently, in the case of layer-by-layer application of the two material components, there would still not be a quaternary system—which is particularly favorable for ohmic contact formation—at the interface between the contact layer and the semiconductor region at the beginning of the heat-treatment process. By contrast, simultaneous application of the two material components also additionally simplifies the fabrication process since a separate process step for a second layer is obviated.

Moreover, a material made of nickel and aluminum affords the advantage over the aluminum-titanium alloy used in the prior art that nickel forms a silicide when heated above 300–400° C., for example during the forming operation, in contrast to the carbide-forming titanium. As a result, a silicon position becomes free in the SiC microstructure of the p-conducting semiconductor region, to which position aluminum can be bound as an acceptor. In contrast to this, however, aluminum cannot be bound as an acceptor, into the crystal microstructure, to a carbon position that becomes free on account of the carbiding of titanium. Therefore, and also due to the higher thermal stability of nickel compared with titanium, a stable contact with a low contact resistance results in the case of a material which is composed of nickel and aluminum and used for the p-type contact region.

After the heat-treatment process, a slight deviation from the material homogeneity is established within the p-type contact region. This slight inhomogeneity stems from exchange processes between the materials in the boundary region of the p-type contact region and of the p-conducting semiconductor region.

Thus, in the boundary region, for example, the aluminum of the applied material will migrate to a certain extent into the p-conducting semiconductor region, where it is bound as an acceptor at the corresponding lattice locations. A shift of the material composition likewise results in the boundary region since the material of the p-type contact region with the nickel contains, as already mentioned, a siliciding material component. Silicon from the p-conducting semiconductor region is consequently mixed together with the nickel of the p-type contact region and forms a corresponding silicide.

However, the region in which the above-described mixing-together processes take place does not extend right into the depth of the p-type contact region, so that the above-mentioned differences in the material composition are primarily produced only in the boundary region. The expression "substantially uniform material composition" is to be understood in this sense.

Moreover, differences in the material composition which are to be attributed to customary contaminants in starting substances are likewise regarded as non-critical here. Such contaminants may be present in a proportion by volume of at most $10^{-3}$, often even just of at most $10^{-6}$.

In one advantageous embodiment, the aluminum is present with a proportion by volume of from 0.1 to 50% in the material. A proportion of from 20 to 50% is particularly preferred here since the contact resistance which can be achieved in this region continuously improves with an increasing proportion of aluminum. It has been shown that the volatilization of the aluminum can be distinctly reduced and even suppressed if the proportion by volume of aluminum is chosen to be less than 50%. In this case, the proportion of nickel in the material, which is then correspondingly greater than 50%, prevents, in particular at rising temperatures, the formation of liquid aluminum islands and the resulting undesirable evaporation of aluminum. Consequently, choosing the proportions of nickel and aluminum within the limits specified additionally increases the stability. This is beneficial particularly during the heat-treatment process which is advantageously carried out for the purpose of forming the ohmic contact, but also if the semiconductor configuration is provided for an application in the high-temperature range. This is a preferred application for an SiC component on account of the outstanding properties of SiC in this regard.

To form a good ohmic contact, it is advantageous if the p-conducting semiconductor region has a sufficiently high dopant concentration at least at the interface between the semiconductor region and the p-type contact region. In this case, the dopant concentration preferably lies between $10^{17}$ cm$^{-3}$ and $10^{20}$ cm$^{-3}$. A particularly good contact results if the dopant concentration is at least $10^{19}$ cm$^{-3}$.

Other embodiments of the method relate to the application of the material to the p-conducting semiconductor region.

In one embodiment of the method, the material which is applied to the two semiconductor regions is taken from at least two separate sources. In this case, the sources each contain at least one material component, in particular the first or the second material component. They are withdrawn from the sources by simultaneous vaporization or sputtering. The p-type contact region is subsequently formed by depositing the material components on the p-conducting semiconductor region. In this case, the material for the p-type contact region is produced either while still in the vapor phase from the individual material components or in the course of the deposition process. The process parameters can ensure that a specific intended mixture ratio is adhered to.

By contrast, an alternative embodiment provides for a source material firstly to be prepared from the first and second material components and then to be sputtered in a second method step. The released particles of the material form the p-type contact region on the p-conducting silicon carbide, as in the previously described embodiment.

In an advantageous embodiment, the semiconductor configuration is subjected to a brief heat-treatment process after the p-type contact region has been applied. In this case, the semiconductor configuration is preferably heated to a maximum temperature of at least 500° C., in particular of about 1000° C., and then held at about this maximum temperature for up to 2 hours, in particular for 2 minutes. However, the heat-treatment process may also include only a heating phase and an immediately following cooling phase, without a hold time at a maximum temperature being provided in between. This process serves for forming the p-type contact region. It has been found that a thermally stable contact with good ohmic characteristics and a low contact resistance results on the p-conducting SiC after this heat-treatment process.

The p-conducting semiconductor region that is to be contact-connected may include different SiC polytypes. There are embodiments in which SiC in the form of 6H, 4H, 15R or 3C SiC is used for the p-conducting semiconductor region. However, other polytypes are likewise possible.

Outside the p-conducting semiconductor region, the semiconductor configuration may also be composed, at least in regions, of a material other than SiC. Therefore, one embodiment provides at least one further semiconductor region, for example a substrate, made of a different material than SiC, for example made of silicon (Si), gallium arsenide (GaAs) or gallium nitride (GaN). This substrate is then integrated at least with the p-conducting semiconductor region made of Sic to form a hybrid semiconductor configuration.

Other features which are considered as characteristic for the invention are set forth in the appended claims.

Although the invention is illustrated and described herein as embodied in a method for contact-connecting a semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
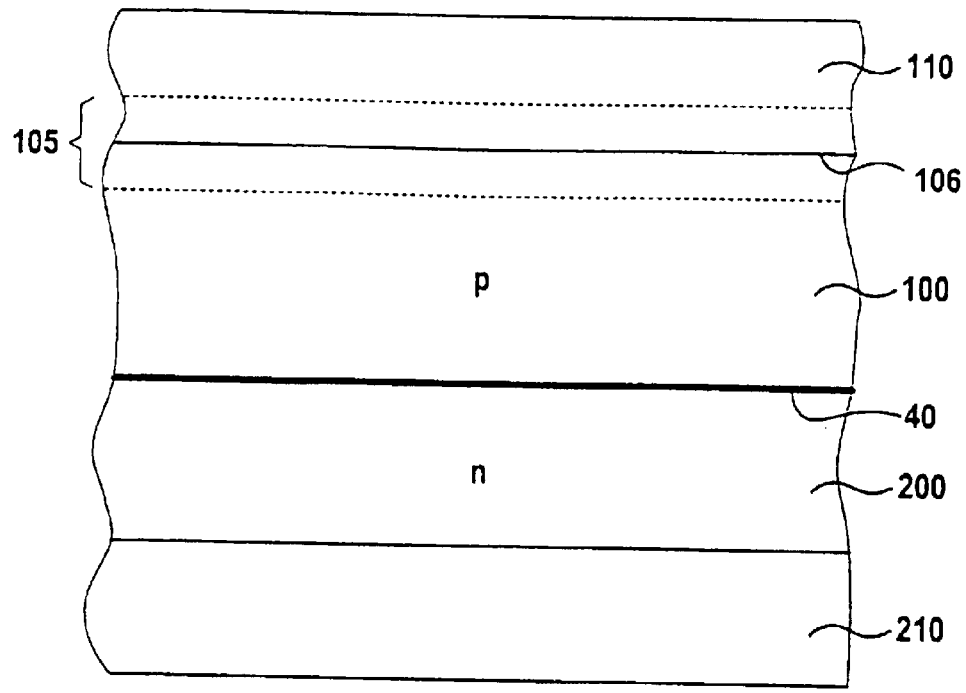
FIG. 1 is a partial, diagrammatic sectional view of a semiconductor configuration in the form of a pn diode having a p-conducting semiconductor region made of SiC and an adjoining p-type contact region.

Referring now to the figures of the drawings in detail, in which corresponding parts are indicated with the same reference symbols, and first, particularly, to FIG. 1 thereof, there is shown a semiconductor configuration which is a pn diode in which an ohmic p-type contact region 110 is provided on an interface 106 of a p-conducting semiconductor region 100 made of 6H SiC. A transition region 105 extends both into the p-type contact region 110 and into the p-conducting semiconductor region 100. An n-conducting semiconductor region 200 likewise made of 6H SiC forms a pn junction 40 with the p-conducting semiconductor region 100. The n-conducting semiconductor region 200 is likewise contact-connected with an ohmic contact region, an n-type contact region 210, on a surface opposite from the pn junction 40.

The pn junction 40 shown in FIG. 1 may constitute a separate component in the form of a pn diode, but it may also be part of a more complex circuit configuration. However, an ohmic contact-connection at least of a p-conducting semiconductor region made of SiC is necessary in both cases.

The p-conducting semiconductor region 100 is doped with a high proportion of acceptors, aluminum in the present case. A p-conducting behavior is produced as a result. By contrast, the n-conducting semiconductor region 200 has a high dopant concentration of nitrogen. Nitrogen constitutes a donor in silicon carbide, so that n-conducting behavior results. The dopant concentrations in the p- and n-conducting semiconductor regions 100 and 200 are $10^{19}$ cm$^{-3}$ in each case. This fosters the formation of good ohmic contacts on the two semiconductor regions 100 and 200. In a boundary region toward the pn junction 40, the n-conducting semiconductor region 200 is doped more weakly, e.g. with a concentration of $10^{15}$ cm$^{-3}$.

The p-type contact region 110 is composed of a material composed of a first and a second material component in the present case. The first material component is nickel and the second is aluminum. The proportion by volume of aluminum is about 30% and that of nickel is about 70%.

Aluminum is used for an ohmic contact-connection on p-conducting SiC, but has a relatively low melting point. In order to avoid any evaporation, nickel is admixed with the material for the p-type contact region 110. In this case, the proportion of nickel is so large that it considerably predominates the proportion of aluminum. On the one hand, this improves the contact resistance, and, on the other hand, this measure results in a considerably improved thermal stability.

The aluminum and nickel are mixed together virtually homogeneously in the complete p-type contact region 110. Only in the boundary region 105 can slight deviations occur on account of material exchange processes in particular after a subsequently performed heat-treatment process.

By contrast, the n-type contact region 210 is composed of pure nickel, which not only forms a good ohmic contact on n-conducting SiC but also has a good thermal stability.

The material for the p-type contact region 110 is produced by vaporization from separate nickel and aluminum sources. The p-type contact region 110 is subsequently formed by depositing the gaseous material on the p-conducting semiconductor region 100. Consequently, nickel and aluminum are already present in the predetermined mixture ratio at the interface 106 after this material application.

In a separate process step, nickel is then likewise deposited by vaporization from a source on the n-conducting semiconductor region 200.

In order to form ohmic, thermally stable contacts, the semiconductor configuration is subsequently subjected to a heat-treatment process lasting approximately two minutes at about 1000° C. After this, a contact resistance of less than $10^{-3}$ Ωcm$^2$ results between the p-conducting semiconductor region 100 and the p-type contact region 110 and a contact resistance of less than $10^{-5}$ Ωcm$^2$ results between the n-conducting semiconductor region 200 and the n-type contact region 210.

Figure 2:
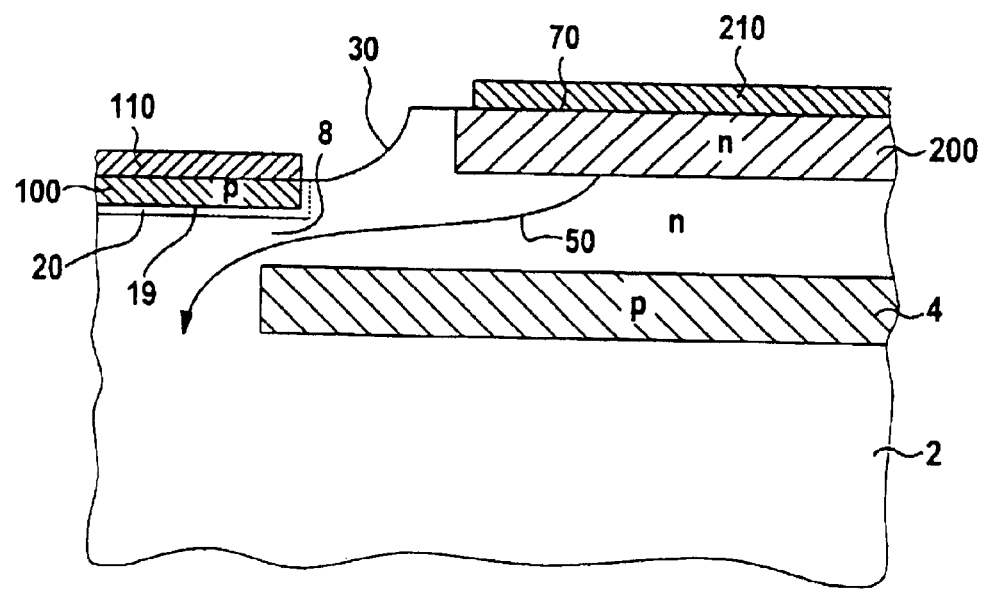
FIG. 2 is a partial, diagrammatic sectional view of a further semiconductor configuration having a p-conducting semiconductor region made of SiC and a p-type contact region.

FIG. 2 illustrates a semiconductor configuration in which the p-type and the n-type contact regions 110 and 210 are provided on a common layer surface 70 of the semiconductor configuration.

The function of the semiconductor configuration of FIG. 2 is controlling a current flow 50, which proceeds from the n-conducting semiconductor region 200 or from the n-type contact region 210 and runs through an n-type SiC layer 2, within a channel region 8 of this n-type SiC layer 2. To that end, the dimensions and thus the resistance of the channel region 8 can be altered by the p-conducting semiconductor region 100 and a p-type island 4 buried in the n-type SiC layer 2. This is done by the application of a voltage to the p-type contact region 110, as a result of which a depletion zone 20 at a pn junction 19 between the n-type SiC layer 2 and the p-conducting semiconductor region 100 extends inter alia into the channel region 8. The dimension of the channel region 8 is additionally preset by providing a depression 30 in which the p-conducting semiconductor region 100 is situated.

Both the p-conducting semiconductor region 100 and the n-conducting semiconductor region 200 require an ohmic contact-connection in the form of the p-type and n-type contact regions 110 and 210, respectively, for the above-described functioning.

The p-conducting semiconductor region 100 has a doping with the acceptor boron and the n-conducting semiconductor region 200 has doping with the donor phosphorous. The dopant concentration is $10^{19}$ cm$^{-3}$ in each case. In the exemplary embodiment of FIG. 2, the material which serves for the p-type contact region 110 is a material mixture which is once again composed of the first material component nickel and the second material component aluminum. In this case, the proportion by volume of aluminum is about 25% and that of nickel is about 75%. Nickel once again serves as the material for the n-type contact region 210. The application of the material and the subsequent heat-treatment process are effected in the manner already described in connection with FIG. 1.

In a preferred embodiment, a plurality of the semiconductor configurations shown in FIGS. 1 and 2 are part of a complex semiconductor configuration which consequently includes a plurality of p-conducting semiconductor regions 100 together with the contact-connection via the associated p-type contact regions 110.

We claim:

1. A method for contacting a semiconductor configuration, the method which comprises:

providing at least one p-conducting semiconductor region formed of silicon carbide; and applying a material having nickel as a first material component and aluminum as a second material component on the at least one p-conducting semiconductor region for forming at least one substantially homogeneous p-type contact region on the at least one p-conducting semiconductor region, by simultaneously applying both, the first material component and the second material component such that a given mixture ratio of the first material component and the second material component is established at an interface between the at least one p-conducting semiconductor region and the at least one p-type contact region prior to a heat-treatment process, the aluminum contained in the material having a proportion by volume of from 0.1% to 50% in the material.

2. The method according to claim 1, which comprises providing the aluminum with a proportion by volume of from 20% to 50% in the material.

3. The method according to claim 1, which comprises providing a dopant concentration of between $10^{17}$ cm$^{-3}$ and $10^{20}$ cm$^{-3}$ in the at least one p-conducting semiconductor region.

4. The method according to claim 1, which comprises applying the material by simultaneously vaporizing from two separate sources of the first and second material components.

5. The method according to claim 1, which comprises applying the material by simultaneously sputtering from two separate sources of the first and second material components.

6. The method according claim 1, which comprises:

preparing in advance a source material from the first and second material components; and subsequently applying the material by sputtering the source material.

7. The method according to claim 1, which comprises heat-treating a semiconductor configuration having the at least one p-conducting semiconductor region and the at least one p-type contact region by heating to a maximum temperature of at least 500° C.

8. The method according to claim 7, which comprises keeping the maximum temperature substantially constant for a duration of at most 2 hours.

9. The method according to claim 7, which comprises keeping the maximum temperature substantially constant for a duration of at most 2 minutes.

10. The method according to claim 1, which comprises heat-treating a semiconductor configuration having the at least one p-conducting semiconductor region and the at least one p-type contact region by heating to a maximum temperature of substantially 1000° C.

11. The method according to claim 10, which comprises keeping the maximum temperature substantially constant for a duration of at most 2 hours.

12. A The method according to claim 10, which comprises keeping the maximum temperature substantially constant for a duration of at most 2 minutes.

\* \* \* \* \*